US012672361B2

(12) United States Patent
Yang et al.

(10) Patent No.: US 12,672,361 B2
(45) Date of Patent: *Jun. 30, 2026

(54) PHOTOVOLTAIC CELL, METHOD FOR FORMING SAME, AND PHOTOVOLTAIC MODULE

(71) Applicant: JINKO SOLAR (HAINING) CO., LTD., Haining City (CN)

(72) Inventors: Nannan Yang, Haining City (CN); Jingsheng Jin, Haining City (CN); Bike Zhang, Haining City (CN)

(73) Assignee: Jinko Solar (Haining) Co., Ltd., Haining City (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/952,996

(22) Filed: Nov. 19, 2024

(65) Prior Publication Data

US 2025/0081631 A1 Mar. 6, 2025

Related U.S. Application Data

(63) Continuation of application No. 17/873,115, filed on Jul. 25, 2022, now Pat. No. 12,218,262.

(30) Foreign Application Priority Data

Mar. 3, 2022 (CN) .......................... 202210202117.2

(51) Int. Cl.
*H10F 19/80* (2025.01)
*H10F 77/70* (2025.01)
*H10W 46/00* (2026.01)

(52) U.S. Cl.
CPC ........... *H10F 19/80* (2025.01); *H10F 77/703* (2025.01); *H10W 46/106* (2026.01); *H10W 46/401* (2026.01)

(58) Field of Classification Search
CPC ........ H10F 19/80; H10F 77/00; H10F 77/703; H01L 2223/54413; H01L 2223/54433; H01L 23/544
See application file for complete search history.

(56) References Cited

U.S. PATENT DOCUMENTS

2003/0075210 A1* 4/2003 Stollwerck ............ H10F 19/804
136/243
2009/0050198 A1 2/2009 Mueller et al.
(Continued)

FOREIGN PATENT DOCUMENTS

CN 101395724 A 3/2009
CN 103477433 A 12/2013
(Continued)

OTHER PUBLICATIONS

JP 2015-005549 A English Translaiton provided by Patent Translate, Powered by Google and EPO, translated on Nov. 14, 2025.*
(Continued)

*Primary Examiner* — Golam Mowla
(74) *Attorney, Agent, or Firm* — USCH Law, PC

(57) ABSTRACT

A photovoltaic cell is provided, including a substrate having a surface with a marked region configured to mark product information of the photovoltaic cell and a non-marked region; a first texture structure in the marked region, including at least one first protrusion structure and at least one second protrusion structure, a respective first protrusion structure includes a truncated pyramid having a recessed top surface recessing toward a bottom surface of the respective first protrusion structure, and a respective second protrusion structure includes a pyramid structure; and a second texture structure disposed in the non-marked region, where the second texture structure includes at least one third protrusion structure, and a respective third protrusion structure of the at
(Continued)

least one third protrusion structure includes a pyramid structure.

18 Claims, 4 Drawing Sheets

(56) References Cited

U.S. PATENT DOCUMENTS

| | | | |
|---|---|---|---|
| 2011/0030761 A1 | 2/2011 | Kalkanoglu et al. |
| 2012/0288989 A1 | 11/2012 | Kuang |
| 2013/0193560 A1 | 8/2013 | Usui |
| 2014/0242801 A1 | 8/2014 | Desplats et al. |
| 2018/0315866 A1 | 11/2018 | Cheong et al. |

FOREIGN PATENT DOCUMENTS

| | | |
|---|---|---|
| CN | 103578349 A | 2/2014 |
| CN | 108346708 A | 7/2018 |
| CN | 208489205 U | 2/2019 |
| CN | 209947851 U | 1/2020 |
| CN | 112185937 A | 1/2021 |
| CN | 112466968 A | 3/2021 |
| CN | 113035978 A | 6/2021 |
| CN | 113540269 A | 10/2021 |
| CN | 113594304 A | 11/2021 |
| CN | 113644154 A | 11/2021 |
| CN | 114334911 A | 4/2022 |
| DE | 102010021428 A1 | 2/2011 |
| JP | 2000150937 A | 5/2000 |
| JP | 2004047776 A | 2/2004 |
| JP | 2009528687 A | 8/2009 |
| JP | 5019397 B2 | 9/2012 |
| JP | 2012222300 A | 11/2012 |
| JP | 2014007382 A | 1/2014 |
| JP | 2014225638 A | 12/2014 |
| JP | 2015005549 A | 1/2015 |
| JP | 2019519942 A | 7/2019 |
| JP | 2021515991 A | 6/2021 |
| WO | 2011013775 A1 | 2/2011 |
| WO | 2012013214 A2 | 2/2012 |

OTHER PUBLICATIONS

Jinko Solar (Haining) Co., Ltd., Non-Final Rejection, U.S. Appl. No. 17/873,115, Jul. 8, 2024, 38 pgs.

Jinko Solar (Haining) Co., Ltd., Extended European Search Report, EP 22185576.0, Jan. 9, 2023, 7 pgs.

Jinko Solar (Haining) Co., Ltd., AU Notice of acceptance for your patent application, AU 2022206801, Jul. 27, 2023, 4 pgs.

Jinko Solar (Haining) Co., Ltd., JP First Office Action with English translation, JP 2022-123618, Sep. 16, 2022, 6 pgs.

Jinko Solar (Haining) Co., Ltd., JP Decision to Grant a Patent with English translation, JP 2023-105909, Sep. 8, 2023, 5 pgs.

Jinko Solar (Haining) Co., Ltd., JP Decision to Grant a Patent with English translation, JP 2023-166792, May 28, 2024, 5 pgs.

Jinko Solar (Haining) Co., Ltd., CN First Office Action with English translation, CN 2022102021172, Apr. 22, 2022, 12 pgs.

* cited by examiner

PHOTOVOLTAIC CELL, METHOD FOR FORMING SAME, AND PHOTOVOLTAIC MODULE

CROSS-REFERENCE TO RELATED APPLICATION

The present application is a continuation of U.S. patent application Ser. No. 17/873,115, filed on Jul. 25, 2022, which claims the benefit of priority under the Paris Convention to Chinese Patent Application No. 202210202117.2 filed on Mar. 3, 2022, each of which is incorporated herein by reference in its entirety.

TECHNIC FIELD

Embodiments of the present disclosure relate in general to photovoltaic technology, and more particularly to a photovoltaic cell, a method for forming the same, and a photovoltaic module.

BACKGROUND

Photovoltaic cells are semiconductor devices that convert solar energy to electrical energy and are used to obtain clean, safe and renewable energy resources. The manufacture of the photovoltaic cells has received extensive attention due to their importance to reduce environmental pollution.

In a conventional process of the production and manufacture of the photovoltaic cell, in order to track processing information of the photovoltaic cell, it is usually necessary to form a marked region for constituting an identification code region on a surface of a substrate, and identify the identification code region constituted by the marked region to obtain the processing information and monitoring parameter information in the processing of the photovoltaic cell. However, generally, the marked region formed on the surface of the substrate affects reflectivity of incident light on the surface of the substrate and the marked region and damages the surface of the substrate, thereby reducing photoelectric conversion efficiency of the photovoltaic cell.

SUMMARY

Some embodiments of the present disclosure provide a photovoltaic cell, a method for forming the same, and a photovoltaic module.

Some embodiments of the present disclosure provide a photovoltaic cell including: a substrate having a surface with a marked region and a non-marked region, where the marked region is configured to mark product information of the photovoltaic cell; a first texture structure in the marked region on the surface of the substrate, where the first texture structure includes at least one first protrusion structure and at least one second protrusion structure, each respective first protrusion structure of the at least one first protrusion structure includes a truncated pyramid having a recessed top surface recessing toward a bottom surface of the respective first protrusion structure, and each respective second protrusion structure of the at least one second protrusion structure includes a pyramid structure; and a second texture structure disposed in the non-marked region, where the second texture structure includes at least one third protrusion structure, and each respective third protrusion structure of the at least one third protrusion structure includes a pyramid structure.

In some embodiments, the photovoltaic cell further includes grid electrodes disposed on the surface of the substrate, and the marked region is disposed between the grid electrodes.

In some embodiments, the photovoltaic cell further includes grid electrodes disposed on the surface of the substrate, the marked region partially overlaps with the grid electrodes, and a number of grid electrodes overlapped with the marked region is in a range of 1 to 5.

In some embodiments, the respective first protrusion structure includes a bottom portion of a pyramid structure under the recessed top surface.

In some embodiments, an included angle between a side wall of the respective first protrusion structure and the bottom surface of the respective first protrusion structure is in a range of 30° to 60°.

In some embodiments, the recessed top surface of the respective first protrusion structure is lower than a top end of a respective second protrusion structure of at least one second protrusion structure adjacent to the respective first protrusion structure in a direction from the substrate toward the first texture structure.

In some embodiments, the recessed top surface of the respective first protrusion structure includes one of a hemispherical recessed surface and a conical recessed surface.

In some embodiments, a ratio of a minimum distance to a maximum distance from the recessed top surface of the respective first protrusion structure to the bottom surface of the respective first protrusion structure in a direction from the substrate toward the first texture structure to is not greater than 85%.

In some embodiments, a minimum distance from the recessed top surface of the respective first protrusion structure to the bottom surface of the respective first protrusion structure in a direction from the substrate toward the first texture structure is in a range of 2 μm to 6 μm.

In some embodiments, the first texture structure includes a plurality of second protrusion structures, and the plurality of second protrusion structures are disposed around the at least one first protrusion structure.

In some embodiments, the first texture structure includes a plurality of first protrusion structures spaced apart, and at least one of the at least one second protrusion structure is disposed between adjacent first protrusion structures.

In some embodiments, at least one of the at least one second protrusion structure includes a first pyramid structure, and a distance between a top end of the first pyramid structure and the surface of the substrate in a direction from the substrate toward the first texture structure is in a range of 4 μm to 8 μm.

In some embodiments, at least one of the at least one second protrusion structure includes a second pyramid structure, a top end of the second pyramid structure is lower than the top end of the first pyramid structure, and the second pyramid structure is adjacent to at least one first pyramid structure.

In some embodiments, the second pyramid structure includes an inclined portion, a side wall of the inclined portion is inclined with respect to the surface of the substrate, and a height of the inclined portion is in a range of 0.8 μm to 3 μm in the direction from the substrate toward the first texture structure.

In some embodiments, the second texture structure includes a plurality of third protrusion structures disposed continuously in a direction perpendicular to a direction from the substrate toward the second texture structure, and each of the plurality of third protrusion structures has an inclined side wall.

In some embodiments, the pyramid structure of the respective third protrusion structure has a bottom surface lower than a bottom surface of the pyramid structure of the respective second protrusion structure.

Some embodiments of the present disclosure provide a method for forming the photovoltaic cell described in the above embodiments including: providing a substrate; forming a marked region on a surface of the substrate; forming a first texture structure in the marked region on the surface of the substrate, where the first texture structure includes at least one first protrusion structure and at least one second protrusion structure, a respective first protrusion structure of the at least one first protrusion structure includes a recessed top surface recessing toward a bottom surface of the respective first protrusion structure, and a respective second protrusion structure of the at least one second protrusion structure includes a pyramid structure; forming a second texture structure on a part of the surface of the substrate outside the marked region, where the second texture structure includes at least one third protrusion structure, and a respective third protrusion structure of the at least one third protrusion structure includes a pyramid structure.

In some embodiments, forming the marked region includes forming the marked region on the surface of the substrate using a laser.

In some embodiments, a wavelength of the laser is 1060 nm, a pulse duration of the laser is in a range of 10 ns to 100 ns, a pulse repetition frequency of the laser is in a range of 500 kHz to 2000 kHz, and a power percentage of the laser is in a range of 70% to 75%.

Some embodiments of the present disclosure provide a photovoltaic module including: a cell string including a plurality of photovoltaic cells, where each of the plurality of photovoltaic cells is the photovoltaic cell according to the above embodiments or is formed according to the above embodiments; an encapsulation layer configured to cover a surface of the cell string; and a cover plate configured to cover a surface of the encapsulation layer away from the cell string.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings are represented as similar elements, and the figures in the accompanying drawings do not constitute a proportion limitation unless otherwise stated.

DETAILED DESCRIPTION OF THE EMBODIMENTS

It is seen from BACKGROUND that, generally, reflectivity of incident light on the surface of the substrate may be affected when the marked region is formed on the surface of the substrate, thereby reducing the photoelectric conversion efficiency of the photovoltaic cell.

In order to solve the above problem, embodiments of the present disclosure provide a photovoltaic cell, which includes a marked region on the surface of the substrate and a non-marked region other than the marked region. A texture surface in the marked region is a first texture structure, a texture surface in the non-marked region is a second texture structure, and a top surface of a first texture structure in the first texture structure is a recessed surface, which is conducive to improving a light limiting effect of the first texture structure, reducing light reflectivity, thereby increasing density of photogenerated carriers in the substrate and improving the photoelectric conversion efficiency of the photovoltaic cell.

Figure 1:
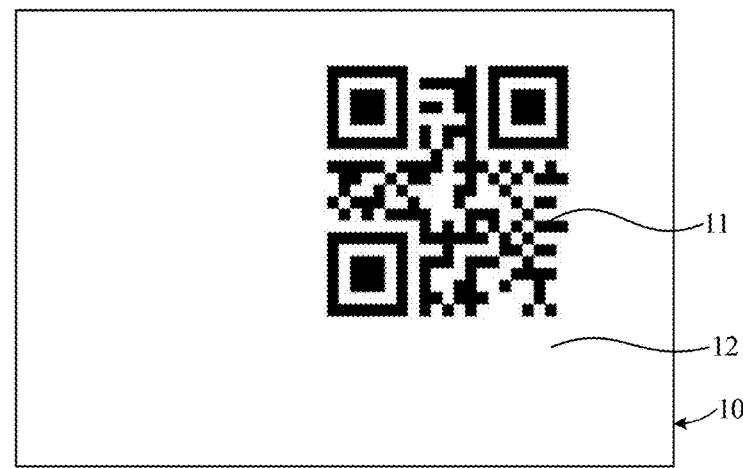
FIG. 1 is a top view of a substrate of a photovoltaic cell according to an embodiment of the present disclosure.
Figure 2:
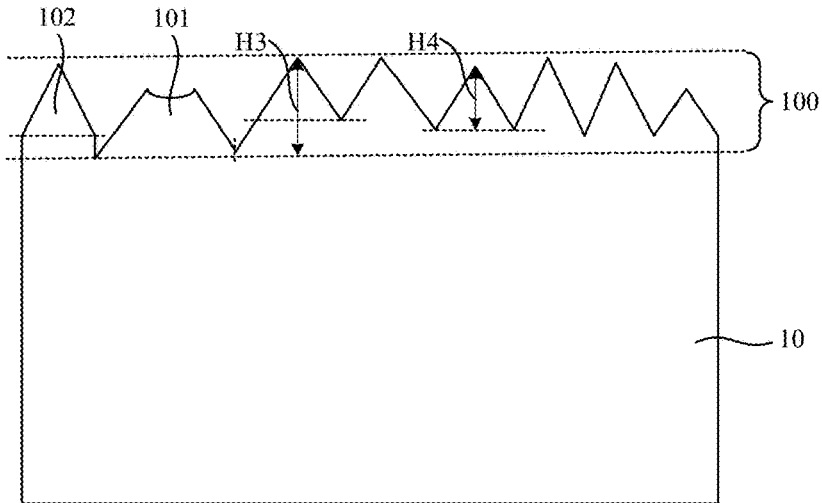
FIG. 2 is a schematic cross-sectional view of a first texture structure of a photovoltaic cell according to an embodiment of the present disclosure.
Figure 3:
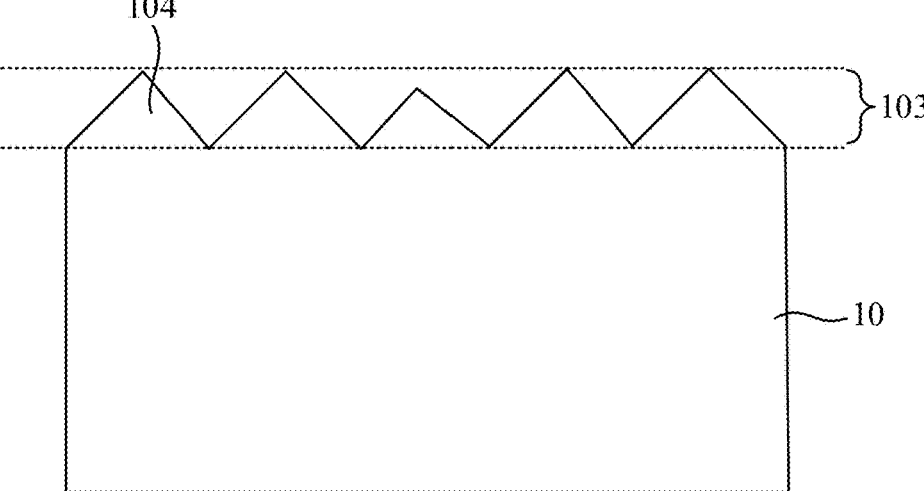
FIG. 3 is a schematic cross-sectional view of a second texture structure of a photovoltaic cell according to an embodiment of the present disclosure.
Figure 4:
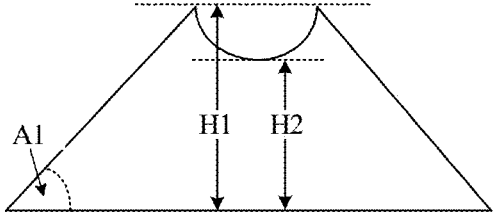
FIG. 4 is another schematic cross-sectional view of a first projection structure in a photovoltaic cell according to an embodiment of the present disclosure.
Figure 5:
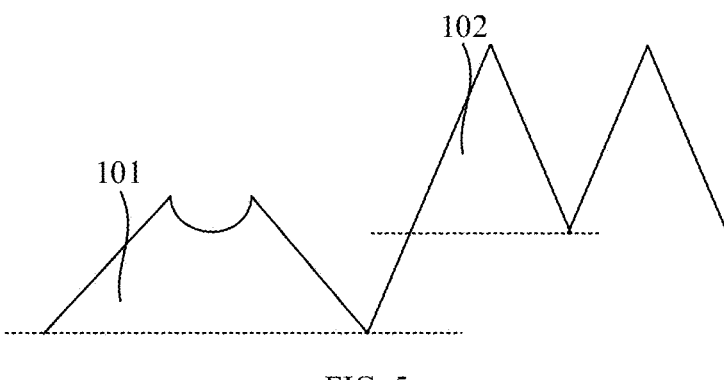
FIG. 5 is another schematic cross-sectional view of a first texture structure in a photovoltaic cell according to an embodiment of the present disclosure.
Figure 6:
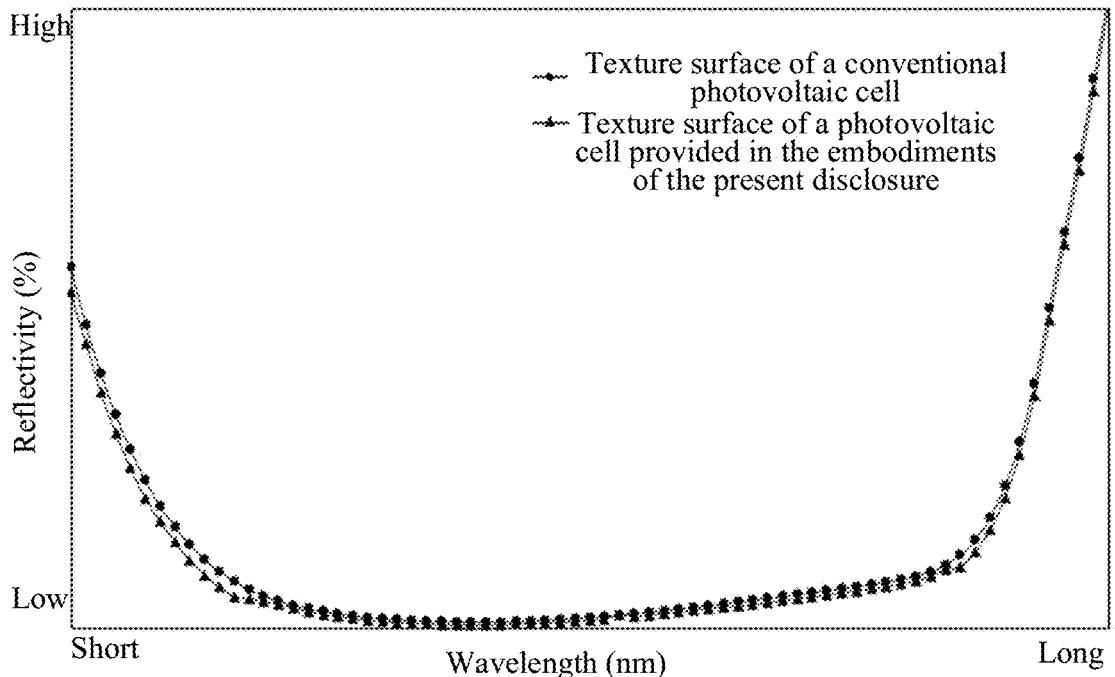
FIG. 6 is a graph showing comparison between reflectivity of a photovoltaic cell according to an embodiment of the present disclosure and reflectivity of a conventional photovoltaic cell.
Figure 7:
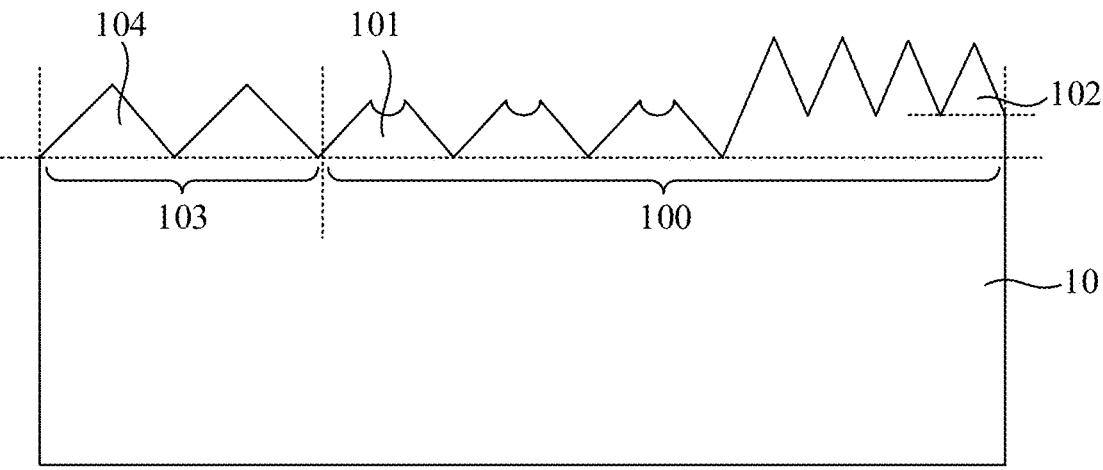
FIG. 7 is another schematic cross-sectional view of a photovoltaic cell according to an embodiment of the present disclosure.
Figure 8:
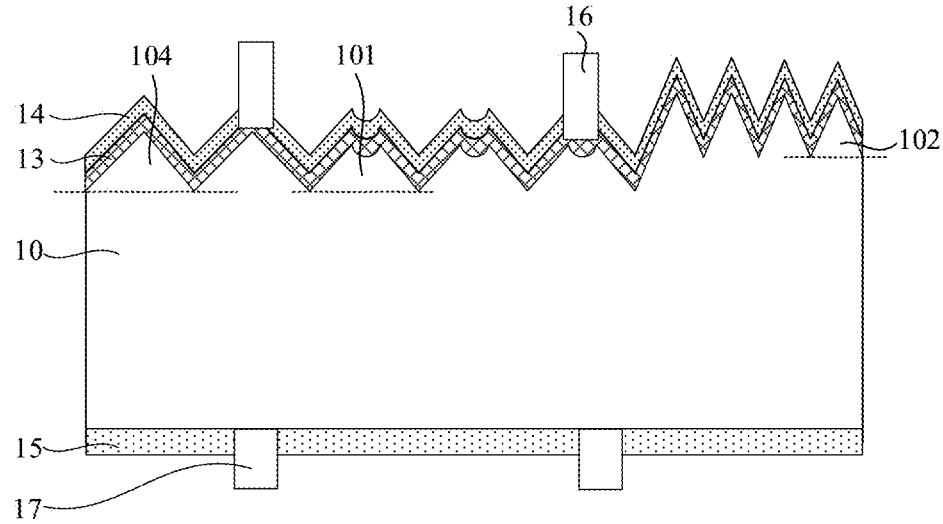
FIG. 8 is still another schematic cross-sectional view of a photovoltaic cell according to an embodiment of the present disclosure.

FIG. 1 is a top view of a substrate of a photovoltaic cell according to an embodiment of the present disclosure. FIG. 2 is a schematic cross-sectional view of a first texture structure of a photovoltaic cell according to an embodiment of the present disclosure. FIG. 3 is a schematic cross-sectional view of a second texture structure of a photovoltaic cell according to an embodiment of the present disclosure. FIG. 4 is another schematic cross-sectional view of a first projection structure in a photovoltaic cell according to an embodiment of the present disclosure. FIG. 5 is another schematic cross-sectional view of a first texture structure in a photovoltaic cell according to an embodiment of the present disclosure. FIG. 6 is a graph showing comparison between reflectivity of a photovoltaic cell according to an embodiment of the present disclosure and reflectivity of a conventional photovoltaic cell. FIG. 7 is another schematic cross-sectional view of a photovoltaic cell according to an embodiment of the present disclosure. FIG. 8 is still another schematic cross-sectional view of a photovoltaic cell according to an embodiment of the present disclosure.

Various embodiments of the present disclosure are described below in detail with reference to the accompanying drawings. Those of ordinary skill in the art should appreciate that many technical details have been proposed in various embodiments of the present disclosure in order to enable the reader to better understand the embodiments of the present disclosure. However, even without these technical details and various changes and modifications based on the following embodiments, the technical solutions provided in the embodiments of the present disclosure are still able to be realized.

Referring to FIGS. 1 to 8, in the embodiments of the present disclosure, a photovoltaic cell includes a substrate 10, a marked region 11 on a surface of the substrate 10, a first texture structure 100 in a marked region on the surface of the substrate, and a second texture structure 103 disposed on a part of the surface of the substrate 10 outside the marked region 11. The marked region 11 is configured to mark product information of the photovoltaic cell such that the production information can be tracked. The first texture structure 100 includes at least one first protrusion structure 101 and at least one second protrusion structure 102, a respective first protrusion structure 101 of the at least one first protrusion structure 101 includes a recessed top surface recessing toward a bottom surface of the respective first protrusion structure 101, and a respective second protrusion structure 102 of the at least one second protrusion structure 102 includes a pyramid structure. In some embodiments, the recessed top surface of the first protrusion structure 101 is a concave surface facing away from the substrate 10. The second texture structure 103 includes at least one third protrusion structure 104, and a respective third protrusion structure 104 of the third protrusion structure 104 includes the pyramid structure.

In some embodiments, the surface of the substrate 10 is a light receiving surface of the photovoltaic cell, i.e., a surface facing towards incident light, and the marked region 11 is disposed on the light receiving surface. The first texture structure 100 and the second texture structure 103 are disposed on the same surface of the substrate 10. Furthermore, the substrate 10 has two opposite surfaces. In some embodiments, the photovoltaic cell is a single-sided cell, one surface of the substrate 10 serves as a light receiving surface and the other surface serves as a backlight surface, and correspondingly, the first texture structure 100 and second texture structure 103 are disposed on the light receiving surface of the substrate 10. In some embodiments, the photovoltaic cell is a double-sided cell, both the two opposite surfaces of the substrate 10 serve as light receiving surfaces, and correspondingly, the marked region 11 may be disposed on at least one of the two opposite surfaces of the substrate 10, i.e., the first texture structure 100 and the second texture structure 103 may be disposed on one of the surfaces of the substrate 10. Alternatively, the marked region 11 may be disposed on the two opposite surfaces of the substrate 10, i.e., both the first texture structure 100 and the second texture structure 103 are disposed on the two opposite surfaces of the substrate 10 respectively. In some embodiments, the substrate 10 may be a silicon substrate 10, and a material of the silicon substrate 10 may include single crystal silicon, polysilicon, amorphous silicon, microcrystalline silicon, etc. In some embodiments, the material of the substrate 10 may also be a carbon element, an organic material, and a plurality of compounds including gallium arsenide, cadmium telluride, copper indium selenium, etc.

In the marked region 11, an identification code pattern is formed, and then the identification code pattern is scanned so as to identify processing information and monitoring parameter information of the photovoltaic cell, which is conducive to tracing the processing process of the photovoltaic cell. Furthermore, even if a passivation film is subsequently formed on the substrate 10, the marked region 11 covered with the transparent passivation film layer does not obstruct reading of the identification code pattern. The identification code pattern may be a one-dimensional graphic code, a two-dimensional graphic code, or a three-dimensional graphic code. In some embodiments, the identification code may also be in the form of a character, a data matrix, a bar code, etc.

In some embodiments, the marked region 11 may be disposed between grid electrodes that are disposed on the surface of the substrate 10, and the marked region 11 does not overlap with the grid electrodes. In some embodiments, the marked region 11 may partially overlap with the grid electrodes formed on the surface of the substrate 10. The number of grid electrodes overlapped with the marked region 11 is in a range of 1 to 5, preferably in a range of 2 to 3. The marked region 11 and the grid electrodes thus provided are able to ensure effective current collection by the gate electrodes and minimize damage to the surface of the substrate 10.

Referring to FIGS. 1 to 3, the light receiving surface of the substrate 10 excluding the marked region 11 is defined as a non-marked region 12. The first texture structure 100 constitutes a texture surface of the marked region 11, the second texture structure 103 constitutes a texture surface of the non-marked region 12, and the first texture structure 100 disposed in the marked region 11 not only ensures that the surface of the substrate 10 has the identification code pattern for tracing the information of the photovoltaic cell, but also facilitates reducing the reflectivity of the incident light received by the photovoltaic cell. This is because the top surface of the first protrusion structure 101 in the first texture structure 100 has a recessed surface compared with the first texture structure 100 being the pyramid structure, the presence of the recessed surface enables the first texture structure 100 to reflect light multiple times, thereby enhancing the light limiting effect of the first texture structure 100 and reducing the reflectivity of the light. Specifically, when light is incident on a first region of the recessed surface of the first protrusion structure 101, part of the light is transmitted through the first protrusion structure 101 into the substrate 10, and the remaining part of the light is reflected through the recessed surface to form reflected light. The reflected light reaches a second region of the recessed surface when propagating, part of the reflected light is transmitted through the first protrusion structure 101 into the substrate 10, and the remaining part of the reflected light is reflected again to form reflected light. The reflected light reaches the recessed surface again when propagating, so that multiple times of transmission of the light is realized so as to increase an absorption rate of the light, thereby increasing the light limiting effect and reducing the reflectivity of the light. It should be understood that the second region and the first region may be different regions of the same recessed surface, or may be different regions of different recessed surfaces of different first protrusion structure 101. The second texture structure 103 also has a good light limiting effect relative to the surface of the smooth substrate 10.

From the above, it is seen that the texture surface formed by the second texture structure 103 and the first texture structure 100 on the light receiving surface of the substrate 10 satisfies the requirement of the product information for marking the photovoltaic cell while enabling the entire surface of the substrate 10 to have a better light limiting effect, which is conducive to improving absorption and utilization of the incident light by the photovoltaic cell.

The first texture structure 100 is composed of at least one first protrusion structure 101 and at least one second protrusion structure 102 connected to each other, and the at least one first protrusion structure 101 and the at least one second protrusion structure 102 are continuously disposed in a direction perpendicular to a direction of the substrate 10 toward the first texture structure 100. Furthermore, the first protrusion structure 101 and the second protrusion structure 102 may be disposed in such a manner that a plurality of contiguous first protrusion structures 101 and a plurality of contiguous second protrusion structures 102 are connected, or the at least one first protrusion structure 101 and the at least one second protrusion structures 102 are disposed irregularly and connected to each other.

In some embodiments, referring to FIGS. 2 and 5, the first protrusion structure 101 is adjacent to at least one second protrusion structure 102, and the recessed top surface of the first protrusion structure 101 is lower than the top end of the second protrusion structure 102 adjacent to the first protrusion structure 101 in a direction of the substrate 10 toward the first texture structure 100. The advantages of such configuration include, on the one hand, that since the second protrusion structure 102 adjacent to the first protrusion structure 101 is higher than the first protrusion structure 101, the reflected light formed after the incident light is reflected through the recessed surface easily reaches the side wall of the second protrusion structure 102, so that the reflected light is reflected on the side wall of the second protrusion structure 102, the reflected light is incident on the recessed surface again to be transmitted into the substrate 10 through the first protrusion structure 101, and part of the reflected light is able to be transmitted to the recessed surface again after the reflection as described above, thereby further improving the absorption rate of the light and the light limiting effect. On the other hand, the incident light from the outside reaches the side wall of the second protrusion structure 102 to form the reflected light, since the first protrusion structure 101 is shorter than the second protrusion structure 102, the reflected light is easily transmitted to the recessed surface so as to be transmitted into the substrate 10, thereby further improving the absorption rate of the light.

In some embodiments, with continued reference to FIG. 2, the first texture structure 100 may include a plurality of second protrusion structures 102, and the plurality of second protrusion structures 102 are disposed around the at least one first protrusion structure 101. The plurality of second protrusion structures 102 may be disposed around one first protrusion structure 101, and the plurality of second protrusion structures 102 may be disposed around the plurality of first protrusion structures 101.

In some embodiments, the first texture structure 100 may include a plurality of spaced apart first protrusion structures 101 with at least one second protrusion structure 102 disposed between adjacent first protrusion structures 101. For example, a plurality of second protrusion structures 102 are provided between the adjacent first protrusion structures 101.

In some embodiments, referring to FIGS. 2 and 4, the first protrusion structure 101 includes a bottom portion of a pyramid structure under the recessed top surface.

Accordingly, the first protrusion structure 101 has a side surface inclined with respect to the surface of the substrate 10, so that the received incident light is able to be reflected again onto the substrate 10, which increases absorption of the incident light by the substrate 10. In some embodiments, the first protrusion structure 101 may also be a conical structure having a recessed surface at a top portion.

In some embodiments, referring to FIGS. 2 and 4, the top surface of the first protrusion structure 101 may be a hemispherical recessed surface, and accordingly, the top surface of the first protrusion structure 101 may have a circular arc shape in cross-section perpendicular to the surface of the substrate 10. In some embodiments, the top surface of the first protrusion structure 101 may also be a conical recessed surface, and accordingly, the top surface of the first protrusion structure 101 has a triangular shape in cross-section perpendicular to the surface of the substrate 10. It is understood that the top surface of the first protrusion structure 101 may be a recessed surface of another shape as long as it is possible to realize multiple reflection of the incident light on the recessed surface.

Referring to FIGS. 2 and 4, an included angle between the side wall of the first protrusion structure 101 and the bottom surface of the first protrusion structure 101 is denoted as A1, and the included angle A1 may be in a range of 30° to 60°. Preferably, the included angle A1 between the side wall of the first protrusion structure 101 and the bottom surface of the first protrusion structure 101 is in a range of 50° to 60°, e.g., 54.74°, 55°, 58°, etc.

In some embodiments, referring to FIGS. 2 and 4, a ratio of a minimum distance H2 to a maximum distance H1 from the recessed top surface to the bottom surface of the same first protrusion structure 101 in the direction of the substrate 10 toward the first texture structure 100 is not greater than 85%. For example, the ratio of H2 to H1 may be 55%, 60%, 70%, 80%, etc.

In some embodiments, referring to FIGS. 2 and 4, the minimum distance H2 from the recessed top surface of the first protrusion structure 101 to the bottom surface of the first protrusion structure 101 in the direction of the substrate 10 toward the first texture structure 100 may be in a range of 2 μm to 6 μm, preferably in a range of 3 μm to 5 μm. For example, H2 is 4.5 μm, the ratio of H2 to H1 is 80%, and H1 is calculated as 5.6 μm.

The second protrusion structure 102 may be a pyramid structure having a tip. In some embodiments, the first texture structure 100 may include a plurality of connected second protrusion structures 102, interface points of adjacent second protrusion structures 102 are spaced from the surface of the substrate 10. That is, the plurality of second protrusion structures 102 may be divided into a base portion constituted by the second protrusion structures 102 connecting to form an integral body and a plurality of inclined portions on the base portion, and side walls of the inclined portions are inclined with respect to the surface of the substrate 10. In some embodiments, the sidewalls of the at least one second protrusion structure 102 may also be adjacent to the surface of the substrate 10.

In some embodiments, referring to FIG. 2, the at least one second protrusion structure 102 is a first pyramid structure, and a distance H3 between a top end of the first pyramid structure and the surface of the substrate 10 in the direction of the substrate 10 toward the first texture structure 100 may be in a range of 4 μm to 8 μm, preferably, H3 may be in a range of 5 μm to 6 μm. For example, H3 is 5 μm, 5.5 μm, 6 μm, etc.

In some embodiments, the at least one second protrusion structure 102 is a second pyramid structure, a top end of the second pyramid structure is lower than the top end of the first pyramid structure, and the second pyramid structure is adjacent to at least one first pyramid structure. The second protrusion structure 102 provided with the first pyramid structure and the second pyramid structure is able to increase an area of the region in which the second protrusion structure 102 receives the incident light as compared to the second protrusion structure 102 provided with the pyramid structure having the same height, thereby further improving the absorption rate of the incident light.

Referring to FIG. 2. in some embodiments, the second pyramid structure includes an inclined portion, the sidewall of the inclined portion is inclined with respect to the surface of the substrate 10, and a height H4 of the inclined portion in the direction of the substrate 10 toward the first texture structure 100 may be in a range of 0.8 μm to 3 μm, preferably in a range of 1 μm to 2 μm. For example, the height H4 of the inclined portion is 1 μm, 1.5 μm, 2 μm, etc.

Referring to FIG. 3, the second texture structure 103 is composed of a plurality of third protrusion structures 104 disposed continuously in a direction perpendicular to a direction of the substrate 10 toward the second texture structure 103. Since the third projection structure 104 is the pyramid structure, the third projection structure 104 also has an inclined side wall, so as to reduce the reflectivity of the substrate 10 to the incident light. In some embodiments, a maximum distance from the third protrusion structure 104 to the surface of the substrate 10 in the direction of the substrate 10 toward the second texture structure 103 may be about 2 μm, and a maximum angle of the tip of the pyramid structure may be about 54.74°. In some embodiments, the third protrusion structure 104 may also be a pyramid structure of other sizes or a tapered structure of other shapes.

In addition, since the surface of the substrate 10 at the non-marked region 12 where the second texture structure 103 is not formed may be a smooth surface, and the surface of the substrate 10 in the marked region 11 where the first texture structure 100 is not formed may be a surface having a recess, the third protrusion structure 104 is different from the second protrusion structure 102. The difference is that the bottom surface of the pyramid structure of the third protrusion structure 104 is lower than the bottom surface of the pyramid structure of the second protrusion structure 102.

The second texture structure 103 is connected to the first texture structure 100 to form a light receiving surface of the substrate 10. In some embodiments, the connection between the first texture structure 100 and the second texture structure 103 may be a connection between the second protrusion structure 102 and the third protrusion structure 104. In such a connection mode, on the one hand, the surface of the substrate 10 has a continuous texture surface, and absorption of the incident light by the substrate 10 is increased. On the other hand, since the bottom surface of the pyramid structure of the third protrusion structure 104 is lower than the bottom surface of the pyramid structure of the second protrusion structure 102, a contacted side surface having a large area is also able to be formed at a connection position of the third protrusion structure 104 and the second protrusion structure 102, which is conducive to improving the absorption effect of the substrate 10 to the incident light. It should be appreciated that in some embodiments, as shown in FIG. 7, the connection between the first texture structure 100 and the second texture structure 103 may be the connection between the first protrusion structure 101 and the third protrusion structure 104, which also provides a continuous texture surface for the surface of the substrate 10, thereby improving the photoelectric conversion efficiency of the photovoltaic cell.

In some embodiments, referring to FIG. 8, the photovoltaic cell may further include an emitter 13, an antireflection layer 14, a passivation layer 15, a first electrode 16, and a second electrode 17. It should be appreciated that the substrate 10 has a texture surface as a light receiving surface and that a surface of the substrate 10 opposite the light receiving surface may be a backlight surface. The emitter 13 may be disposed on the light receiving surface of the substrate 10, and a doping element of the emitter 13 may be a P-type doping element (such as boron, aluminum, gallium, indium, thallium, etc.) or an N-type doping element (such as phosphorus, arsenic, antimony, bismuth, etc.). Furthermore, a PN junction is formed between the substrate 10 and the emitter 13. For example, the emitter 13 includes the N-type doping element, and the substrate 10 includes the P-type doping element. The emitter 13 includes the P-type doping element, and the substrate 10 includes the N-type doping element. The antireflection layer 14 is disposed on a surface of the emitter 13 away from the substrate 10, and plays a role of antireflection of the incident light, i.e., to reduce the reflectivity of the substrate 10 to the incident light. The passivation layer 15 is disposed on the backlight surface of the substrate 10 to play a role of passivation protection. The first electrode 16 is disposed on the light receiving surface of the substrate 10 and penetrates the antireflection layer 14 to be electrically connected to the emitter 13. The second electrode 17 is disposed on the backlight surface of the substrate 10 and penetrates the passivation layer 15 to be electrically connected to the substrate 10.

Referring to FIG. 6, a topography of the first protrusion structure 101 and a topography of the second protrusion structure 102 in a conventional photovoltaic cell are both conventional pyramid structures having tips. The abscissa in FIG. 6 shows a wavelength of the incident light, and the ordinate in FIG. 6 shows the reflectivity of the texture surface the photovoltaic cell. It is seen from FIG. 6 that the reflectivity of the photovoltaic cell provided in the embodiment of the present disclosure is lower than that of the conventional photovoltaic cell. Therefore, the technical solution provided in the embodiment of the present disclosure is able to increase the absorption of the incident light, and improve reduction of cell efficiency due to the damage of the marked region 11.

The photovoltaic cell provided in the above embodiments has the marked region 11 on the surface of the substrate 10 for receiving the incident light, and the marked region 11 is configured to constitute the identification code pattern, and the identification code pattern is scanned so that the processing information of the photovoltaic cell is able to be quickly obtained, which is conducive to improving information integration and information tracing in the production process of the photovoltaic cell. The texture surface disposed on the surface of the substrate 10 includes the first texture structure 100 in the marked region 11 and the second texture structure 103 at the non-marked region 12, the first protrusion structure 101 and the second protrusion structure 102 are connected to form the first texture structure 100, and the third protrusion structures 104 are connected to form the second texture structure 103. Since the first protrusion structure 101, the second protrusion structure 102 and the third protrusion structure 104 have the effect of reducing the reflectivity, the first texture structure 100 and the second texture structure 103 also have the effect of reducing the reflectivity. Thus, the surface of the substrate 10 formed by the first texture structure 100 and the second texture structure 103 has a better light limiting effect, which is conducive to increasing the photoelectric conversion efficiency of the photovoltaic cell.

Accordingly, embodiments of the present disclosure further provide a method for forming a photovoltaic cell, which is able to be used to form the photovoltaic cell provided in the above embodiments. It should be noted that the same or corresponding parts with the above embodiments may be described in detail with reference to the above embodiments, and details will not be described below.

Figure 9:
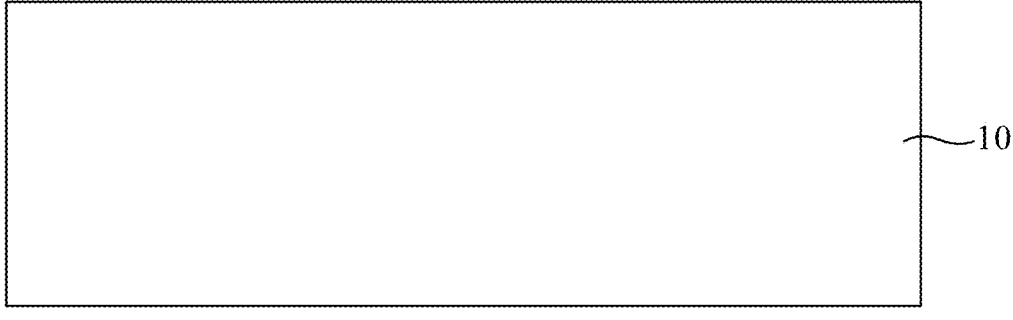
FIG. 9 is a schematic cross-sectional view of a substrate of a photovoltaic cell according to an embodiment of the present disclosure.
Figure 10:
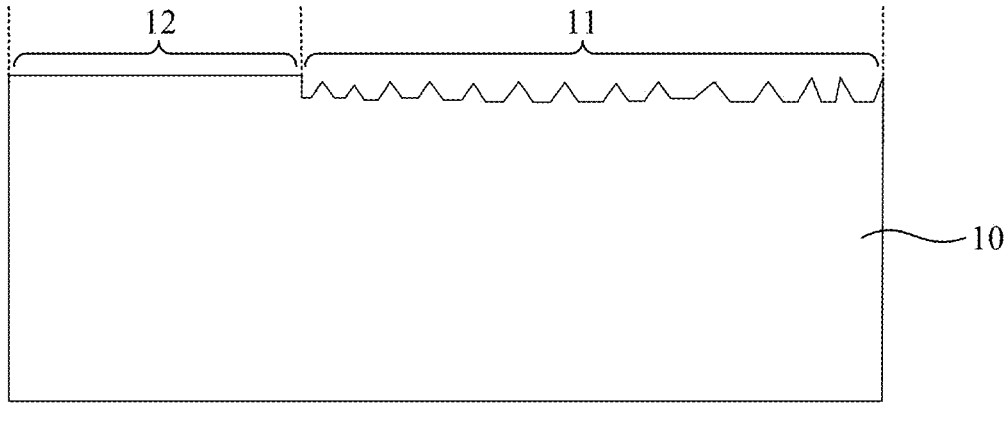
FIG. 10 is a schematic cross-sectional view of a substrate of a photovoltaic cell having a marked region according to an embodiment of the present disclosure.

FIG. 9 is a schematic cross-sectional view of a substrate of a photovoltaic cell according to an embodiment of the present disclosure. FIG. 10 is a schematic cross-sectional view of a substrate of a photovoltaic cell having a marked region according to an embodiment of the present disclosure.

Referring to FIGS. 7 to 10, the method for forming the photovoltaic cell includes providing a substrate 10, forming a marked region 11 on a surface of the substrate 10, forming a first texture structure 100 in the marked region 11 of the surface of the substrate 10, and forming a second texture structure 102 on a part of the surface of the substrate 10 outside the marked region 11. The first texture structure 100 includes at least one first protrusion structure 101 and at least one second protrusion structure 102, a respective first protrusion structure 101 of the at least one first protrusion structure 101 has a recessed top surface recessing toward a bottom surface of the respective first protrusion structure 101, and a respective second protrusion structure 102 of the at least one second protrusion structure 102 includes a pyramid structure. The second texture structure 103 includes at least one third protrusion structure 104, and a respective third protrusion structure 104 of the third protrusion structure 104 includes a pyramid structure.

Referring to FIG. 9, the substrate 10 has two opposite surfaces, i.e., a front surface and a rear surface of the substrate 10, respectively. The front surface of the substrate 10 is defined as a light receiving surface. Referring to FIG. 10, the marked region 11 is formed on the front surface of the substrate 10. It should be appreciated that, in some embodiments, the rear surface of the substrate 10 is defined as the light receiving surface and the surface of the substrate 10 forming the marked region 11 may also be the rear surface.

Referring to FIG. 10, the marked region 11 may be a recess or a line of connected recesses, which constitutes an identification code pattern for identifying information of the photovoltaic cell, and the substrate 10 of each independent photovoltaic cell has an independent and unique identification code pattern, and the information of the identification code pattern is identified and analyzed by photographing the identification code pattern, which is conducive to tracing the processing information and monitoring parameter information of the photovoltaic cell.

In some embodiments, an operation of forming the marked region 11 includes forming the marked region 11 on the surface of the substrate 10 using a laser.

When using the laser to form the marked region 11, the shape and depth of the recesses formed on the surface of the substrate 10 are more easily controlled, thereby controlling subsequent forming of a specific structure of the texture surface, so as to form the first protrusion structure 101 and the second protrusion structure 102 having better light limiting effects. It should be appreciated that, in some embodiments, the marked region 11 may also be formed by plasma etching, high energy particle impact, chemical etching, etc.

In some embodiments, a wavelength of the laser forming the marked region 11 is 1060 nm, a pulse duration of the laser is in a range of 10 ns to 100 ns, a pulse repetition frequency of the laser is in a range of 500 kHz to 2000 kHz, and a power percentage of the laser is in a range of 70% to 75%.

The size of the recesses formed after the laser processing determines the size of the second protrusion structure 102

(as shown in FIG. 7) and the angle of the recessed surface of the first protrusion structure 101 at the top (as shown in FIG. 7) in a subsequent texture making process. Through the marked region 11 formed by the laser having the above parameters, the first texture structure 100 having the first protrusion structure 101 and the second protrusion structure 102 (as shown in FIG. 7) is formed after the texture making, which is able to reduce the reflectivity of the incident light by 0.3% as compared to the texture surface formed without the laser treatment, thereby forming the photovoltaic cell with higher efficiency.

Referring to FIG. 7, after the surface of the substrate 10 is coded, a texture surface is formed by texture making. The purpose of texture making is that the substrate 10 of the photovoltaic cell is processed through a plurality of processes such as slicing, grinding, chamfering, polishing, and the like, and a lot of impurities such as particles, metal particles, silicon dust or organic matter are adsorbed on the surface of the substrate 10. Before further diffusion or other processing, texture making is required to eliminate various pollutants, remove a mechanical damage layer on the surface of the substrate 10, and obtain a texture surface capable of capturing more photons.

In some embodiments, the texture making method may be using an alkali solution to etch, the alkali solution includes a solution containing NaOH, KOH, TMAH, etc. Since recesses of different degrees are formed in the marked region 11 on the surface of the substrate 10, when the alkali solution performs anisotropic etching on crystal planes, a crystal plane having recesses is etched to form a pyramid structure. As the etching proceeds, a small texture is formed on the surface of the pyramid structure to form the second protrusion structure 102. In the non-etching crystal plane, the recess is remained to form a protrusion structure having a recessed top surface, i.e., the first protrusion structure 101. The third protrusion structure 104 is formed on the surface of the substrate 10 excluding the marked region 11. In some embodiments, the texture making method may be at least one of electrochemical texture making, reactive ion etching texture making, laser texture making, and mask texture making.

With continued reference to FIG. 7, after the texture making, the texture surface formed in the marked region 11 is the first texture structure 100, and the texture surface formed on the surface of the substrate 10 excluding the marked region 11 is the second texture structure 103. The first texture structure 100 includes the first protrusion structure 101 and the second protrusion structure 102, and the second texture structure 103 includes the third protrusion structure 104. The first protrusion structure 101 having a recessed top surface, the second protrusion structure 102 having an inclined side surface, and the third protrusion structure 104 enable the first texture structure 100 and the second texture structure 103 on the surface of the substrate 10 to have a better light limiting effect, thereby being able to capture more photons and improving the photoelectric conversion efficiency of the photovoltaic cell. For specific shapes of the first texture structure 100, the second texture structure 103, the first protrusion structure 101, the second protrusion structure 102, and the third protrusion structure 104, the above embodiments may be referred to, and details are not described herein.

Referring to FIG. 8, in some embodiments, the processing method of the photovoltaic cell may further include forming an emitter 13, an antireflection layer 14, a passivation layer 15, a first electrode 16, and a second electrode 17 on the substrate 10 of the photovoltaic cell.

The method for forming the photovoltaic cell provided in the above embodiments is able to trace the processing information of each individual photovoltaic cell by forming the marked region 11 on the surface of the substrate 10 using the laser. When the marked region 11 is formed using the laser, the surface of the substrate 10 having recesses is formed, and the surface of the substrate 10 having the recesses may form the first texture structure 100 in subsequent texture making. In addition, the second texture structure 103 is formed after texturing making of the surface of the substrate which has not been subjected to the laser treatment. The first texture structure 100 is provided with the first protrusion structure 101 and the second protrusion structure 102 connected to each other, and the second texture structure 103 is provided with the third protrusion structures 104 connected to each other. Since the first protrusion structure 101, the second protrusion structure 102, and the third protrusion structure 104 have good light limiting effects, both the first texture structure 100 and the second texture structure 103 have an effect of reducing reflectivity. Thus, the surface of the substrate 10 formed by the first texture structure 100 and the second texture structure 103 is able to reduce the reflectivity of the incident light and improve the photoelectric conversion efficiency of the photovoltaic cell.

Figure 11:
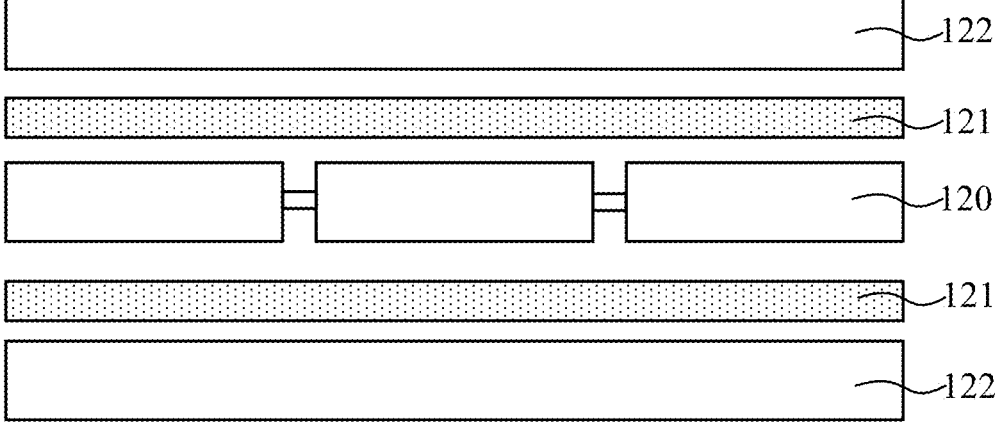
FIG. 11 is a schematic structural diagram of a photovoltaic module according to an embodiment of the present disclosure.

Accordingly, embodiments of the present disclosure further provide a photovoltaic module including the photovoltaic cell having the marked region 11 provided in the above embodiments. FIG. 11 is a schematic structural diagram of a photovoltaic module according to an embodiment of the present disclosure.

Referring to FIG. 11, the photovoltaic module includes a cell string 120 including a plurality of photovoltaic cells, an encapsulation layer 121 configured to cover a surface of the cell string 120, and a cover plate 122 configured to cover a surface of the encapsulation layer 121 away from the cell string 120. The plurality of photovoltaic cells are electrically connected to form a plurality of cell strings 120 in a form of a whole piece or a plurality of pieces.

In the photovoltaic module provided in the above embodiments, since the texture surface of the photovoltaic cell has a better light limiting effect, the photovoltaic cell has better photoelectric performance, so that the photovoltaic module has higher photoelectric conversion efficiency.

Those of ordinary skill in the art should appreciate that the embodiments described above are specific embodiments of the present disclosure, and in practical application, various changes may be made thereto in form and detail without departing from the spirit and scope of the present disclosure. Any person skilled in the art may make his or her own changes and modifications without departing from the spirit and scope of the present disclosure. Therefore, the protection scope of the present disclosure shall be subject to the scope limited by the claims.

What is claimed is:

1. A photovoltaic cell, comprising:
a substrate having a surface with a marked region and a non-marked region, wherein the marked region is configured to mark product information of the photovoltaic cell;
a first texture structure in the marked region, wherein the first texture structure includes at least one first protrusion structure and at least one second protrusion structure, each respective first protrusion structure of the at least one first protrusion structure includes a truncated pyramid having a recessed top surface recessing toward a bottom of the respective first protrusion structure, and each respective second protrusion structure of the at least one second protrusion structure includes a pyramid structure; and
a second texture structure disposed in the non-marked region, wherein the second texture structure includes at least one third protrusion structure, and each respective third protrusion structure of the at least one third protrusion structure includes a pyramid structure;
wherein the at least one second protrusion structure includes at least one pyramid structure adjacent to the respective first protrusion structure, the at least one pyramid structure having a top end higher than the recessed top surface of the respective first protrusion structure in a direction away from the surface of the substrate.

2. The photovoltaic cell according to claim 1, wherein the photovoltaic cell further includes grid electrodes disposed on the surface of the substrate, and the marked region is disposed between the grid electrodes.

3. The photovoltaic cell according to claim 1, wherein the photovoltaic cell further includes grid electrodes disposed on the surface of the substrate, the marked region partially overlaps with the grid electrodes, and a number of grid electrodes overlapped with the marked region is in a range of 1 to 5.

4. The photovoltaic cell according to claim 1, wherein a ratio of a minimum distance to a maximum distance from the recessed top surface of the respective first protrusion structure to the bottom surface of the respective first protrusion structure in a direction from the substrate toward the first texture structure is not greater than 85%.

5. The photovoltaic cell according to claim 1, wherein a minimum distance from the recessed top surface of the respective first protrusion structure to the bottom surface of the respective first protrusion structure in a direction from the substrate toward the first texture structure is in a range of 2 μm to 6 μm.

6. The photovoltaic cell according to claim 1, wherein the first texture structure includes a plurality of second protrusion structures, and the plurality of second protrusion structures are disposed around the at least one first protrusion structure.

7. The photovoltaic cell according to claim 1, wherein the first texture structure includes a plurality of first protrusion structures spaced apart, and at least one of the at least one second protrusion structure is disposed between adjacent first protrusion structures.

8. The photovoltaic cell according to claim 1, wherein at least one of the at least one second protrusion structure includes a first pyramid structure, and a distance between a top end of the first pyramid structure and the surface of the substrate in a direction from the substrate toward the first texture structure is in a range of 4 μm to 8 μm.

9. The photovoltaic cell according to claim 8, wherein at least one of the at least one second protrusion structure includes a second pyramid structure, a top end of the second pyramid structure is lower than the top end of the first pyramid structure, and the second pyramid structure is adjacent to at least one first pyramid structure.

10. The photovoltaic cell according to claim 9, wherein the second pyramid structure includes an inclined portion, a side wall of the inclined portion is inclined with respect to the surface of the substrate, and a height of the inclined portion is in a range of 0.8 μm to 3 μm in the direction from the substrate toward the first texture structure.

11. The photovoltaic cell according to claim 1, wherein the second texture structure includes a plurality of third protrusion structures disposed continuously in a direction perpendicular to a direction from the substrate toward the second texture structure, and each of the plurality of third protrusion structures has an inclined side wall.

12. The photovoltaic cell according to claim 1, wherein the pyramid structure of the respective third protrusion structure has a bottom surface lower than a bottom surface of the pyramid structure of the respective second protrusion structure.

13. A photovoltaic module, comprising:

a cell string including a plurality of photovoltaic cells;

an encapsulation layer configured to cover a surface of the cell string; and a cover plate configured to cover a surface of the encapsulation layer away from the cell string;

wherein each of the plurality of photovoltaic cells comprises:

a substrate having a surface with a marked region and a non-marked region, wherein the marked region is configured to mark product information of the photovoltaic cell;

a first texture structure in the marked region, wherein the first texture structure includes at least one first protrusion structure and at least one second protrusion structure, each respective first protrusion structure of the at least one first protrusion structure includes a truncated pyramid having a recessed top surface recessing toward a bottom of the respective first protrusion structure, and each respective second protrusion structure of the at least one second protrusion structure includes a pyramid structure; and a second texture structure disposed in the non-marked region, wherein the second texture structure includes at least one third protrusion structure, and a respective third protrusion structure of the at least one third protrusion structure includes a pyramid structure;

wherein the at least one second protrusion structure includes at least one pyramid structure adjacent to the respective first protrusion structure, the at least one pyramid structure having a top end higher than the recessed top surface of the respective first protrusion structure in a direction away from the surface of the substrate.

14. The photovoltaic module according to claim 13, wherein the photovoltaic cell further includes grid electrodes disposed on the surface of the substrate, and the marked region is disposed between the grid electrodes.

15. The photovoltaic module according to claim 13, wherein the pyramid structure of the respective third protrusion structure has a bottom surface lower than a bottom surface of the pyramid structure of the respective second protrusion structure.

16. The photovoltaic module according to claim 13, wherein a ratio of a minimum distance to a maximum distance from the recessed top surface of the respective first protrusion structure to the bottom surface of the respective first protrusion structure in a direction from the substrate toward the first texture structure to is not greater than 85%.

17. The photovoltaic module according to claim 13, wherein a minimum distance from the recessed top surface of the respective first protrusion structure to the bottom surface of the respective first protrusion structure in a direction from the substrate toward the first texture structure is in a range of 2 μm to 6 μm.

18. The photovoltaic module according to claim 13, wherein the first texture structure includes a plurality of second protrusion structures, and the plurality of second protrusion structures are disposed around the at least one first protrusion structure.

* * * * *